(12) United States Patent  
Katsianos

(10) Patent No.: US 8,315,398 B2  
(45) Date of Patent: Nov. 20, 2012

(54) SYSTEM FOR ADJUSTING PERCEIVED LOUDNESS OF AUDIO SIGNALS

(75) Inventor: Themis Katsianos, Highland, CA (US)

(73) Assignee: DTS LLC, Calabasas, CA (US)

( * ) Notice: Subject to any disclaimer, the term of this patent is extended or adjusted under 35 U.S.C. 154(b) by 682 days.

(21) Appl. No.: 12/340,364

(22) Filed: Dec. 19, 2008

(65) Prior Publication Data

US 2009/0161883 A1 Jun. 25, 2009

Related U.S. Application Data

(60) Provisional application No. 61/016,270, filed on Dec. 21, 2007.

(51) Int. Cl.
*H04R 29/00* (2006.01)
(52) U.S. Cl. ............... 381/56; 381/58; 381/59; 381/98; 381/101; 381/102; 381/103; 381/104
(58) Field of Classification Search ................ 381/56, 381/58, 59, 104, 106, 107, 98, 103, 101, 381/102
See application file for complete search history.

(56) References Cited

U.S. PATENT DOCUMENTS

| | | |
|---|---|---|
| 3,665,345 A | 5/1972 | Dolby |
| 3,828,280 A | 8/1974 | Dolby |
| 3,845,416 A | 10/1974 | Dolby |
| 3,846,719 A | 11/1974 | Dolby |
| 3,903,485 A | 9/1975 | Dolby |
| 3,967,219 A | 6/1976 | Dolby |
| 4,074,083 A | 2/1978 | Berkovitz et al. |
| 4,355,383 A | 10/1982 | Dolby |
| 4,490,691 A | 12/1984 | Dolby |
| 4,700,361 A | 10/1987 | Todd et al. |
| 4,739,514 A | 4/1988 | Short et al. |
| 4,887,299 A | 12/1989 | Cummins et al. |
| 5,027,410 A | 6/1991 | Williamson et al. |
| 5,172,358 A | 12/1992 | Kimura |
| 5,237,559 A | 8/1993 | Murphy et al. |
| 5,278,912 A | 1/1994 | Waldhauer |
| 5,363,147 A | 11/1994 | Joseph et al. |
| 5,402,500 A | 3/1995 | Sims, Jr. |

(Continued)

FOREIGN PATENT DOCUMENTS

AU 2005299410 5/2006

(Continued)

OTHER PUBLICATIONS

Digital Entertainment, Perceptual Loudness, Management for Broadcast Applications, White Paper, 18 pages, Jun. 2010.
Recommendation ITU-R BS.1770, Algorithms to measure audio programme loudness and true-peak audio level, pp. 1-19, 2006.
ITU-R Radio Sector of ITU, Recommendation ITU-R BS,1770-2, Algorithms to Measure Audio Programme Loudness and True-Peak Audio Level, 24 pages, Mar. 2011.

(Continued)

*Primary Examiner* — Tan N Tran
(74) *Attorney, Agent, or Firm* — Knobbe Martens Olson & Bear LLP

(57) ABSTRACT

A method of adjusting a loudness of an audio signal may include receiving an electronic audio signal and using one or more processors to process at least one channel of the audio signal to determine a loudness of a portion of the audio signal. This processing may include processing the channel with a plurality of approximation filters that can approximate a plurality of auditory filters that further approximate a human hearing system. In addition, the method may include computing at least one gain based at least in part on the determined loudness to cause a loudness of the audio signal to remain substantially constant for a period of time. Moreover, the method may include applying the gain to the electronic audio signal.

7 Claims, 13 Drawing Sheets

U.S. PATENT DOCUMENTS

| | | | |
|---|---|---|---|
| 5,500,902 A | 3/1996 | Stockham, Jr. et al. |
| 5,530,760 A | 6/1996 | Paisley |
| 5,544,140 A | 8/1996 | Seagrave et al. |
| 5,579,404 A | 11/1996 | Fielder et al. |
| 5,583,962 A | 12/1996 | Davis et al. |
| 5,615,270 A | 3/1997 | Miller et al. |
| 5,623,577 A | 4/1997 | Fielder |
| 5,631,714 A | 5/1997 | Saadoun |
| 5,632,003 A | 5/1997 | Davidson et al. |
| 5,632,005 A | 5/1997 | Davis et al. |
| 5,633,981 A | 5/1997 | Davis |
| 5,659,466 A | 8/1997 | Norris et al. |
| 5,663,727 A | 9/1997 | Vokac |
| 5,710,752 A | 1/1998 | Seagrave et al. |
| 5,727,119 A | 3/1998 | Davidson et al. |
| 5,757,465 A | 5/1998 | Seagrave et al. |
| 5,848,171 A | 12/1998 | Stockham, Jr. et al. |
| 5,862,228 A | 1/1999 | Davis |
| 5,873,065 A | 2/1999 | Akagiri et al. |
| 5,896,358 A | 4/1999 | Endoh et al. |
| 5,909,664 A | 6/1999 | Davis et al. |
| 6,002,776 A | 12/1999 | Bhadkamkar et al. |
| 6,016,295 A | 1/2000 | Endoh et al. |
| 6,021,386 A | 2/2000 | Davis et al. |
| 6,041,295 A | 3/2000 | Hinderks |
| 6,084,974 A | 7/2000 | Niimi |
| 6,088,461 A | 7/2000 | Lin et al. |
| 6,108,431 A | 8/2000 | Bachler |
| 6,148,085 A | 11/2000 | Jung |
| 6,185,309 B1 | 2/2001 | Attias |
| 6,211,940 B1 | 4/2001 | Seagrave et al. |
| 6,240,388 B1 | 5/2001 | Fukuchi |
| 6,263,371 B1 | 7/2001 | Geagan, III et al. |
| 6,301,555 B2 | 10/2001 | Hinderks |
| 6,311,155 B1 | 10/2001 | Vaudrey et al. |
| 6,327,366 B1 | 12/2001 | Uvacek et al. |
| 6,332,119 B1 | 12/2001 | Hinderks |
| 6,351,733 B1 | 2/2002 | Saunders et al. |
| 6,370,255 B1 | 4/2002 | Schaub et al. |
| 6,430,533 B1 | 8/2002 | Kolluru et al. |
| 6,442,278 B1 | 8/2002 | Vaudrey et al. |
| 6,442,281 B2 | 8/2002 | Sato et al. |
| 6,446,037 B1 | 9/2002 | Fielder et al. |
| 6,473,731 B2 | 10/2002 | Hinderks |
| 6,498,822 B1 | 12/2002 | Tanaka |
| 6,529,605 B1 | 3/2003 | Christoph |
| 6,624,873 B1 | 9/2003 | Callahan, Jr. et al. |
| 6,639,989 B1 | 10/2003 | Zacharov et al. |
| 6,650,755 B2 | 11/2003 | Vaudrey et al. |
| 6,651,041 B1 | 11/2003 | Juric |
| 6,664,913 B1 | 12/2003 | Craven et al. |
| 6,760,448 B1 | 7/2004 | Gundry |
| 6,784,812 B2 | 8/2004 | Craven et al. |
| 6,891,482 B2 | 5/2005 | Craven et al. |
| 6,920,223 B1 | 7/2005 | Fosgate |
| 6,970,567 B1 | 11/2005 | Gundry et al. |
| 6,980,933 B2 | 12/2005 | Cheng et al. |
| 7,058,188 B1 | 6/2006 | Allred |
| 7,072,477 B1 | 7/2006 | Kincaid |
| 7,116,789 B2 | 10/2006 | Layton et al. |
| 7,251,337 B2 | 7/2007 | Jacobs |
| 7,280,664 B2 | 10/2007 | Fosgate et al. |
| 7,283,954 B2 | 10/2007 | Crockett et al. |
| 7,395,211 B2 | 7/2008 | Watson et al. |
| 7,418,394 B2 | 8/2008 | Cowdery |
| 7,448,061 B2 | 11/2008 | Richards et al. |
| 7,454,331 B2 | 11/2008 | Vinton et al. |
| 7,461,002 B2 | 12/2008 | Crockett et al. |
| 7,508,947 B2 | 3/2009 | Smithers |
| 7,533,346 B2 | 5/2009 | Mcgrath et al. |
| 7,536,021 B2 | 5/2009 | Dickins et al. |
| 7,539,319 B2 | 5/2009 | Dickins et al. |
| 7,551,745 B2 | 6/2009 | Gundry et al. |
| 7,583,331 B2 | 9/2009 | Whitehead |
| 7,610,205 B2 | 10/2009 | Crockett |
| 7,617,109 B2 | 11/2009 | Smithers et al. |
| 7,711,123 B2 | 5/2010 | Crockett |
| 7,751,572 B2 | 7/2010 | Villemoes et al. |
| 7,756,274 B2 | 7/2010 | Layton et al. |
| 7,784,938 B2 | 8/2010 | Richards |
| 7,925,038 B2 | 4/2011 | Taenzer et al. |
| 7,965,848 B2 | 6/2011 | Villemoes et al. |
| 7,973,878 B2 | 7/2011 | Whitehead |
| 8,019,095 B2 | 9/2011 | Seefeldt |
| 8,032,385 B2 | 10/2011 | Smithers et al. |
| RE42,935 E | 11/2011 | Cheng et al. |
| 8,085,941 B2 | 12/2011 | Taenzer |
| RE43,132 E | 1/2012 | Jacobs |
| 8,090,120 B2 | 1/2012 | Seefeldt |
| 8,144,881 B2 | 3/2012 | Crockett et al. |
| 2001/0027393 A1 | 10/2001 | Touimi et al. |
| 2002/0013698 A1 | 1/2002 | Vaudrey et al. |
| 2002/0040295 A1 | 4/2002 | Saunders et al. |
| 2002/0076072 A1 | 6/2002 | Cornelisse |
| 2002/0097882 A1 | 7/2002 | Greenberg et al. |
| 2002/0146137 A1 | 10/2002 | Kuhnel et al. |
| 2002/0147595 A1 | 10/2002 | Baumgarte |
| 2003/0002683 A1 | 1/2003 | Vaudrey et al. |
| 2003/0035549 A1 | 2/2003 | Bizjak |
| 2004/0024591 A1 | 2/2004 | Boillot et al. |
| 2004/0042617 A1 | 3/2004 | Beerends et al. |
| 2004/0044525 A1 | 3/2004 | Vinton et al. |
| 2004/0076302 A1 | 4/2004 | Christoph |
| 2004/0122662 A1 | 6/2004 | Crockett et al. |
| 2004/0148159 A1 | 7/2004 | Crockett et al. |
| 2004/0165730 A1 | 8/2004 | Crockett et al. |
| 2004/0172240 A1 | 9/2004 | Crockett et al. |
| 2004/0184537 A1 | 9/2004 | Geiger et al. |
| 2004/0190740 A1 | 9/2004 | Chalupper et al. |
| 2005/0069162 A1 | 3/2005 | Haykin et al. |
| 2006/0002572 A1 | 1/2006 | Smithers et al. |
| 2006/0129256 A1 | 6/2006 | Melanson et al. |
| 2007/0027943 A1 | 2/2007 | Jensen et al. |
| 2007/0056064 P1 | 3/2007 | Roose et al. |
| 2007/0092089 A1 | 4/2007 | Seefeldt et al. |
| 2007/0268461 A1 | 11/2007 | Whitehead |
| 2007/0291959 A1 | 12/2007 | Seefeldt |
| 2008/0284677 A1 | 11/2008 | Whitehead et al. |
| 2009/0063159 A1 | 3/2009 | Crockett |
| 2009/0067644 A1 | 3/2009 | Crockett et al. |
| 2009/0097676 A1 | 4/2009 | Seefeldt |
| 2009/0161883 A1 | 6/2009 | Katsianos |
| 2009/0220109 A1 | 9/2009 | Crockett et al. |
| 2009/0271185 A1 | 10/2009 | Smithers et al. |
| 2009/0290727 A1 | 11/2009 | Seefeldt |
| 2009/0304190 A1 | 12/2009 | Seefeldt et al. |
| 2009/0322800 A1 | 12/2009 | Atkins |
| 2010/0042407 A1 | 2/2010 | Crockett |
| 2010/0049346 A1 | 2/2010 | Boustead et al. |
| 2010/0060857 A1 | 3/2010 | Richards et al. |
| 2010/0066976 A1 | 3/2010 | Richards et al. |
| 2010/0067108 A1 | 3/2010 | Richards et al. |
| 2010/0067709 A1 | 3/2010 | Seefeldt |
| 2010/0073769 A1 | 3/2010 | Richards et al. |
| 2010/0076769 A1 | 3/2010 | Yu |
| 2010/0083344 A1 | 4/2010 | Schildbach et al. |
| 2010/0106507 A1 | 4/2010 | Muesch |
| 2010/0121634 A1 | 5/2010 | Muesch |
| 2010/0174540 A1 | 7/2010 | Seefeldt |
| 2010/0177903 A1 | 7/2010 | Vinton et al. |
| 2010/0179808 A1 | 7/2010 | Brown |
| 2010/0185439 A1 | 7/2010 | Crockett |
| 2010/0198377 A1 | 8/2010 | Seefeldt |
| 2010/0198378 A1 | 8/2010 | Smithers et al. |
| 2010/0202632 A1 | 8/2010 | Seefeldt et al. |
| 2010/0250258 A1 | 9/2010 | Smithers et al. |
| 2011/0009987 A1 | 1/2011 | Seefeldt |
| 2011/0022402 A1 | 1/2011 | Engdegard et al. |
| 2011/0022589 A1 | 1/2011 | Bauer et al. |
| 2011/0054887 A1 | 3/2011 | Muesch |
| 2011/0125507 A1 | 5/2011 | Yu |
| 2011/0137662 A1 | 6/2011 | Mcgrath et al. |
| 2011/0153050 A1 | 6/2011 | Bauer et al. |
| 2011/0188704 A1 | 8/2011 | Radhakrishnan et al. |
| 2011/0208528 A1 | 8/2011 | Schildbach et al. |
| 2011/0219097 A1 | 9/2011 | Crockett et al. |
| 2011/0221864 A1 | 9/2011 | Filippini et al. |

| | | | |
|---|---|---|---|
| 2011/0222835 A1 | 9/2011 | Dougherty et al. | |
| 2011/0227898 A1 | 9/2011 | Whitehead | |
| 2011/0243338 A1 | 10/2011 | Brown | |
| 2011/0274281 A1 | 11/2011 | Brown et al. | |
| 2011/0311062 A1 | 12/2011 | Seefeldt et al. | |
| 2012/0008800 A1 | 1/2012 | Goerke | |
| 2012/0039490 A1 | 2/2012 | Smithers | |
| 2012/0046772 A1 | 2/2012 | Dickins | |
| 2012/0063121 A1 | 3/2012 | Atkins | |

FOREIGN PATENT DOCUMENTS

| | | |
|---|---|---|
| AU | 2007243586 | 11/2007 |
| AU | 2007309691 | 5/2008 |
| AU | 2008266847 | 12/2008 |
| BR | PI0518278-6 | 11/2008 |
| BR | PU0709877-4 | 7/2011 |
| BR | PI0711062-4 | 8/2011 |
| CA | 2581810 | 5/2006 |
| CN | 200580036760.7 | 10/2007 |
| CN | 200780011056.5 | 4/2009 |
| CN | 200780011710.2 | 4/2009 |
| CN | 200780014742.8 | 5/2009 |
| CN | 200780038594.3 | 9/2009 |
| CN | 200780049200.4 | 11/2009 |
| CN | 200780040917.2 | 12/2009 |
| CN | 200880008969.6 | 3/2010 |
| CN | 200880024506.9 | 6/2010 |
| CN | 200880024525.1 | 7/2010 |
| DE | 43 35 739 A1 | 5/1994 |
| EP | 0 661 905 B1 | 3/1995 |
| EP | 05818505.9 | 7/2007 |
| EP | 1 850 328 | 10/2007 |
| EP | 1987586 | 5/2008 |
| EP | 2082480 | 5/2008 |
| EP | 2122828 | 7/2008 |
| EP | 077753095.4 | 12/2008 |
| EP | 07754779.2 | 1/2009 |
| EP | 08768564.0 | 3/2010 |
| EP | 08780173.4 | 3/2010 |
| EP | 10184647.5 | 12/2010 |
| EP | 08780174.2 | 11/2011 |
| FR | 282 0573 | 8/2002 |
| HK | 09112054.9 | 12/2009 |
| HK | 10107878.0 | 5/2010 |
| HK | 09106026.6 | 7/2011 |
| JP | 6-334459 | 12/1994 |
| JP | 7-122953 | 5/1995 |
| JP | 2006-524968 | 11/2006 |
| JP | 2007-539070 | 5/2008 |
| JP | 2009-504190 | 9/2009 |
| JP | 2009-504219 | 9/2009 |
| JP | 2009-507694 | 10/2009 |
| JP | 2009-533304 | 3/2010 |
| JP | 2009-535268 | 3/2010 |
| JP | 2009-544836 | 5/2010 |
| JP | 2009-553658 | 6/2010 |
| JP | 2010-517000 | 10/2010 |
| JP | 2010-516999 | 12/2010 |
| JP | 2011-025711 | 8/2011 |
| KR | 10-2009-7016247 | 9/2009 |
| KR | 10-2009-7019501 | 2/2010 |
| KR | 10-2008-7029070 | 6/2011 |
| MX | 2007/0005027 | 6/2007 |
| MX | 2008/013753 | 3/2009 |
| MX | 2009/004175 | 4/2009 |
| MY | PI 20084037 | 3/2007 |
| MY | PI 20091346 | 8/2011 |
| MY | PI 20093743 | 8/2011 |
| RU | 2008143336 | 5/2010 |
| RU | 2008146747 | 6/2010 |
| RU | 2009118955 | 11/2010 |
| RU | 2009135056 | 3/2011 |
| RU | 2010105052 | 8/2011 |
| RU | 2010105057 | 8/2011 |
| SG | 200702926-7 | 10/2005 |
| SG | 200807478-3 | 3/2007 |
| SG | 200902133-8 | 9/2007 |
| SG | 200906211-8 | 6/2008 |
| TW | 94138593 | 7/2006 |
| TW | 96111810 | 4/2007 |
| TW | 96111338 | 1/2008 |
| TW | 96108528 | 2/2008 |
| TW | 96136545 | 7/2008 |
| TW | 96139833 | 7/2008 |
| TW | 96148397 | 9/2008 |
| TW | 97122852 | 3/2009 |
| TW | 97126352 | 3/2009 |
| TW | 97126643 | 4/2009 |
| TW | 99112159 | 2/2011 |
| TW | 99113664 | 2/2011 |
| TW | 99113477 | 7/2011 |
| VN | 1-2009-01972 | 4/2010 |
| VN | 1-2008-02889 | 4/2011 |
| VN | 1-2009-01011 | 6/2011 |
| WO | WO 2005/086139 A1 | 0/2005 |
| WO | WO 97/25834 A2 | 7/1997 |
| WO | WO 03/090208 A1 | 10/2003 |
| WO | WO 2004/019656 A2 | 3/2004 |
| WO | WO 2004/073178 A2 | 8/2004 |
| WO | WO 2004/098053 | 11/2004 |
| WO | WO 2004/111994 A2 | 12/2004 |
| WO | WO 2006/019719 A1 | 2/2005 |
| WO | WO 2006/047600 | 5/2006 |
| WO | WO 2006/113047 A1 | 10/2006 |
| WO | WO 2004/021332 | 3/2011 |

OTHER PUBLICATIONS

Advanced Television Systems Committee Inc., ATSC Recommended Practice: Techniques for Establishing and Maintaining Audio Loudness for Digital Television, May 25, 2011.

Lund, *Control of Loudness in Digital TV*, (2006 NAB BEC Proceedings, pp. 57-65).

Skovenborg et al., *Evaluation of Different Loudness Models with Music and Speech Material* (2004, 117th Convention of the Audio Engineering Society, San Francisco, CA USA).

Skovenborg et al., *Evaluation of Designs for Loudness-Matching Experiments* (2004, Poznan, Poland).

Immerseel et al., *Digital Implementation of Linear Gammatone Filters: Comparison of Design Methods*, (2003; 4(3):59-64, Acoustics Research Letters Online).

Glasberg et al., *A Model of Loudness Applicable to Time-Varying Sounds* (Journal of the Audio Engineering Society, Audio Engineering Society, New York, vol. 50, May 2002, pp. 331-342).

Moore, et al., *A Model for the Prediction of Thresholds, Loudness and Partial Loudness* (Journal of the Audio Engineering Society, Audio Engineering Society, New York, vol. 45, No. 4, Apr. 1997, pp. 224-240).

Zwicker et al., *Psychoacoustics: Facts and Models* (Springer-Verlag. Chapter 8, "Loudness," pp. 203-208, Berlin Heidelberg, 1990, 1999).

Hauenstein, M., *A Computationally Efficient Algorithm for Calculating Loudness Patterns of Narrowband Speech* (Acoustics, Speech and Signal Processing,1997 ICASSP-97 IEEE International Conference on Munich, Germany Apr. 21-24, 1997, Los Alamitos, CA, IEEE Comput. Soc., US, Apr. 21, 1997, pp. 1311-1314).

Stevens, *Calculations of the Loudness of Complex Noise* (Journal of the Acoustical Society of America 1956.

Zwicker, *Psychological and Methodical Basis of Loudness* (Acoustica, 1958).

Australian Broadcasting Authority (ABA) *Investigation into Loudness of Advertisements* (Jul. 2002).

Lin, L., et al. *Auditory Filter Bank Design using Masking Curves* (7th European Conference on Speech Communication and Technology, Sep. 2001).

ISO226: 2003 (E) *Acoustics—Normal Equal Loudness Level Contours*.

Seefeldt, et al., *A New Objective Measure of Perceived Loudness*, (Audio Engineering Society, Convention Paper 6236, 117th Convention, San Francisco, CA. Oct. 28-31, 2004).

International Search Report for International Application No. PCT/US2008/087791, mailed on Feb. 24, 2009.

Office Action issued in corresponding Japanese Application No. 2010-539900 on Jun. 12, 2012.

Extended Search Report issued in European application No. 08868264.6 on Sep. 12, 2012.

SYSTEM FOR ADJUSTING PERCEIVED LOUDNESS OF AUDIO SIGNALS

RELATED APPLICATION

This application claims the benefit of priority under 35 U.S.C. §119(e) of U.S. Provisional Patent Application No. 61/016,270, filed on Dec. 21, 2007, and entitled "System for Adjusting Perceived Loudness of Audio Signals," the disclosure of which is hereby incorporated by reference in its entirety.

BACKGROUND

Description of the Related Technology

One complaint voiced by many television viewers is the changes in volume viewers endure during commercial breaks and when switching between different channels. Similar volume extremes may also occur with other devices, such as portable audio players, A/V receivers, personal computers, and vehicle audio systems. One solution for this problem is automatic gain control (AGC). A typical automatic gain control (AGC) works by reacting to volume changes by cutting an audio signal at high amplitude and then boosting it at low amplitude—no matter where in the frequency range the loudness spike occurs.

When the AGC kicks in, unwanted changes and unnatural artifacts can often be heard in the form of pumping and breathing fluctuations. Pumping fluctuations can be the result of bass tones disappearing when the loudness suddenly increases, like during a loud action sequence. Breathing fluctuations can happen when low level hiss is boosted during quiet passages. Unfortunately, this brute force method of handling volume changes does not take into account how humans actually perceive change in volume.

SUMMARY

In certain embodiments, a method of adjusting a loudness of an audio signal includes receiving an electronic audio signal and using one or more processors to process at least one channel of the audio signal to determine a loudness of a portion of the audio signal. This processing may include processing the channel with a plurality of approximation filters that can approximate a plurality of auditory filters that further approximate a human hearing system. In addition, the method may include computing at least one gain based at least in part on the determined loudness to cause a loudness of the audio signal to remain substantially constant for a period of time. Moreover, the method may include applying the gain to the electronic audio signal.

In various embodiments, a method of adjusting a loudness of an audio signal includes receiving an electronic audio signal having two or more channels of audio and selecting a channel of the two or more audio channels. The selecting may include determining a dominant channel of the two or more audio channels and selecting the dominant channel. The method may further include using one or more processors to process the selected channel to determine a loudness of a portion of the audio signal and computing at least one gain based at least in part on the determined loudness. Additionally, the method may include applying the at least one gain to the electronic audio signal.

In certain implementations, a system for adjusting a loudness of an audio signal includes a pre-processing module that can receive an electronic audio signal having one or more channels of audio and select at least one of the channels of audio. The system may further include a loudness analysis module having one or more processors that can compute a loudness of the at least one selected channel. The system may further include a gain control module that can compute at least one gain based at least in part on the loudness. The gain computation may include calculating a gain for the at least one selected channel of the audio signal based at least partly on the estimated loudness and applying the gain to each channel of the audio signal.

In certain embodiments, a method of distinguishing background sounds from other sounds may include receiving an electronic audio signal having two or more channels of audio, selecting a portion of the electronic audio signal, analyzing a phase between each channel of the selected portion of the electronic audio signal to determine a number of samples that have a corresponding phase, and comparing the number of samples to a threshold to determine whether the selected portion of the electronic audio signal corresponds to background noise.

In certain embodiments, a system for adjusting a loudness of an audio signal may include an audio signal having one or more channels of audio, a loudness module having one or more processors that can compute a loudness of the audio signal, where the computation includes processing the audio signal with a plurality of infinite impulse response (IIR) filters, where each of the IIR filters is a band-pass filter, and where the IIR filters can approximate a human hearing system. The system may further include a gain module that can compute a gain based at least in part on the computed loudness.

For purposes of summarizing the disclosure, certain aspects, advantages and novel features of the inventions have been described herein. It is to be understood that not necessarily all such advantages may be achieved in accordance with any particular embodiment of the inventions disclosed herein. Thus, the inventions disclosed herein may be embodied or carried out in a manner that achieves or optimizes one advantage or group of advantages as taught herein without necessarily achieving other advantages as may be taught or suggested herein.

BRIEF DESCRIPTION OF THE DRAWINGS

Throughout the drawings, reference numbers may be re-used to indicate correspondence between referenced elements. The drawings are provided to illustrate embodiments of the inventions described herein and not to limit the scope thereof.

DETAILED DESCRIPTION

Some volume control systems attempt to take loudness into account in determining how to vary gain. Loudness can be an attribute of the auditory system that can allow for classification of sounds on a scale from quiet to loud. Loudness can be measured in a unit called the "phon." When we listen to different types of audio material, it is the subjective quantity of loudness that we use in order for our ears to categorize the intensity of the various sounds presented to them and generate a listening sensation. Perceived loudness may vary with frequency, unlike sound pressure levels measured in decibels (dB). Volume control systems that model the human ear based on loudness often use complex, high-order filters to model the human hearing system. These systems can consume significant computing resources and thereby limit their capability to function in certain devices, such as televisions and car audio systems.

This disclosure describes certain systems and methods for adjusting the perceived loudness of audio signals. In certain embodiments, an estimated loudness of an audio signal is determined using one or more processing-efficient techniques. These techniques may include using lower-order filters that approximate the filter banks modeling the human ear, decimating the audio signal to reduce the number of audio samples processed, processing fewer than all audio channels, and smoothing gain coefficients rather than smoothing an output signal. Advantageously, in certain embodiments, applying one or more of these techniques can enable lower-capability processors, such as may be found in many electronic devices, to dynamically adjust the loudness of audio signals.

Figure 1A:
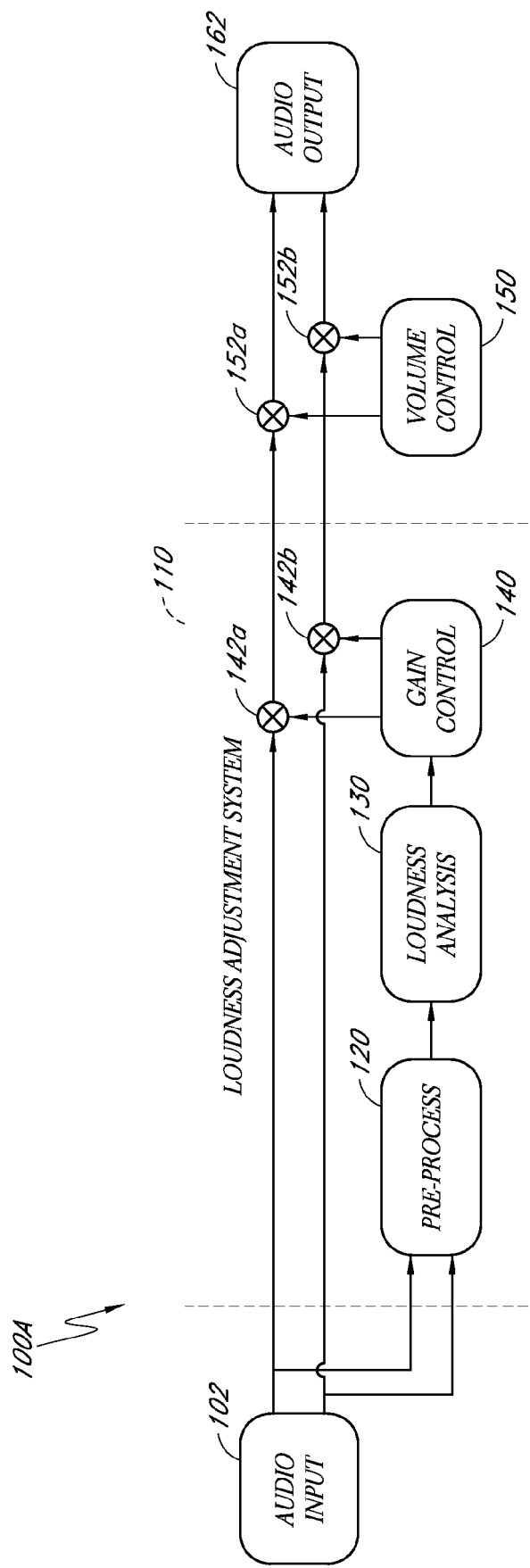
FIG. 1A illustrates an embodiment of a system for adjusting the perceived loudness of audio signals.

Referring to FIG. 1A, an embodiment of an audio system 100A is shown that includes a loudness adjustment system 110 for adjusting the perceived loudness of audio signals. The audio system 100A may be implemented in any machine that reproduces audio, such as a television, a computer, portable audio players, headphones, A/V receivers, vehicle audio systems, and the like. Advantageously, in certain embodiments, the loudness adjustment system 110 adjusts a loudness of an audio input signal 102 to maintain the loudness at a certain level. For example, the loudness adjustment system 110 may maintain a certain loudness of television audio when a user switches channels or when a commercial begins broadcasting. The loudness analysis module 110 can perform these functions while using computing resources efficiently.

As shown in FIG. 1A, the loudness adjustment system 110 receives an audio input signal 102. In the depicted embodiment, the audio input signal 102 includes two channels, such as stereo channels. In other embodiments, the audio input signal 102 includes one channel or more than two channels. For instance, 5.1, 6.1, or 7.1 surround sound channels or matrix encoded channels such as Circle Surround encoded channels or the like may be provided. The audio input signal 102 can be an electrical signal or the like that represents a real, physical sound, such as music, voice, effects, combinations of the same, and the like.

A pre-process module 120 of the loudness adjustment system 110 receives the audio input signal 102. The pre-process module 120 may include hardware and/or software for gathering energy information from each channel of the audio input signal 102. Using the energy information in one embodiment, the pre-process module 120 can determine at least one dominant channel to be analyzed for loudness by a loudness analysis module 130. More generally, the pre-process module 120 may select a subset of the channels of the audio input signal 102 for loudness analysis. By using fewer than all of the channels to determine loudness, in certain embodiments, the pre-process module 120 can reduce computing resources used to determine loudness.

The loudness analysis module 130 can include hardware and/or software for estimating loudness based on the channel or channels selected by the pre-processing module 120. The loudness analysis module 130 can compare the estimated loudness of the selected channel with a reference loudness level. If the estimated loudness differs from the reference loudness level, the loudness analysis module 130 can output the level difference between the estimated loudness and the reference level. As will be described below, a gain control module 140 can use this level difference to adjust a gain applied to the audio input signal 102.

In certain embodiments, the loudness analysis module 130 uses a nonlinear multiband model of the human hearing system to analyze the loudness characteristics of the audio input signal 102. This model can simulate the filter bank behavior of the human peripheral auditory system. As such, the model can account for loudness, which may be a subjective measure of sound intensity, by estimating the loudness of the audio input signal 102.

Figure 1B:
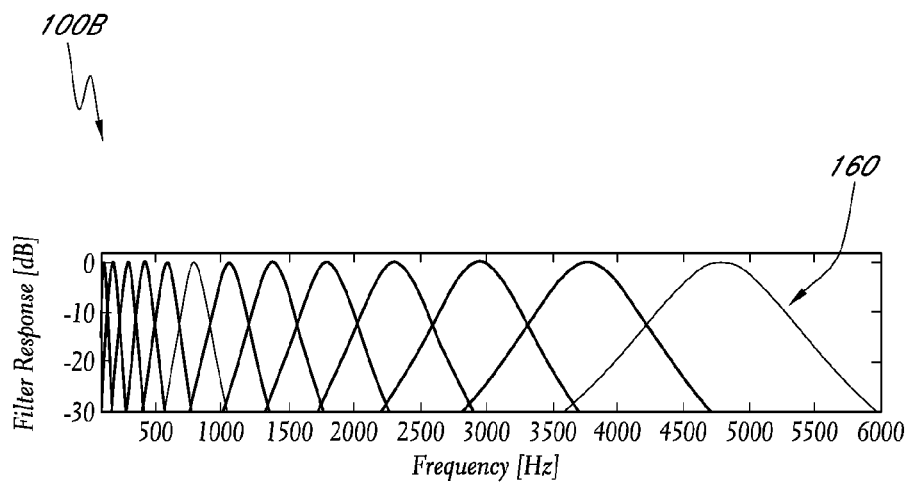
FIG. 1B illustrates an example bank of auditory filters similar to the filters used by the human ear.
Figure 8:
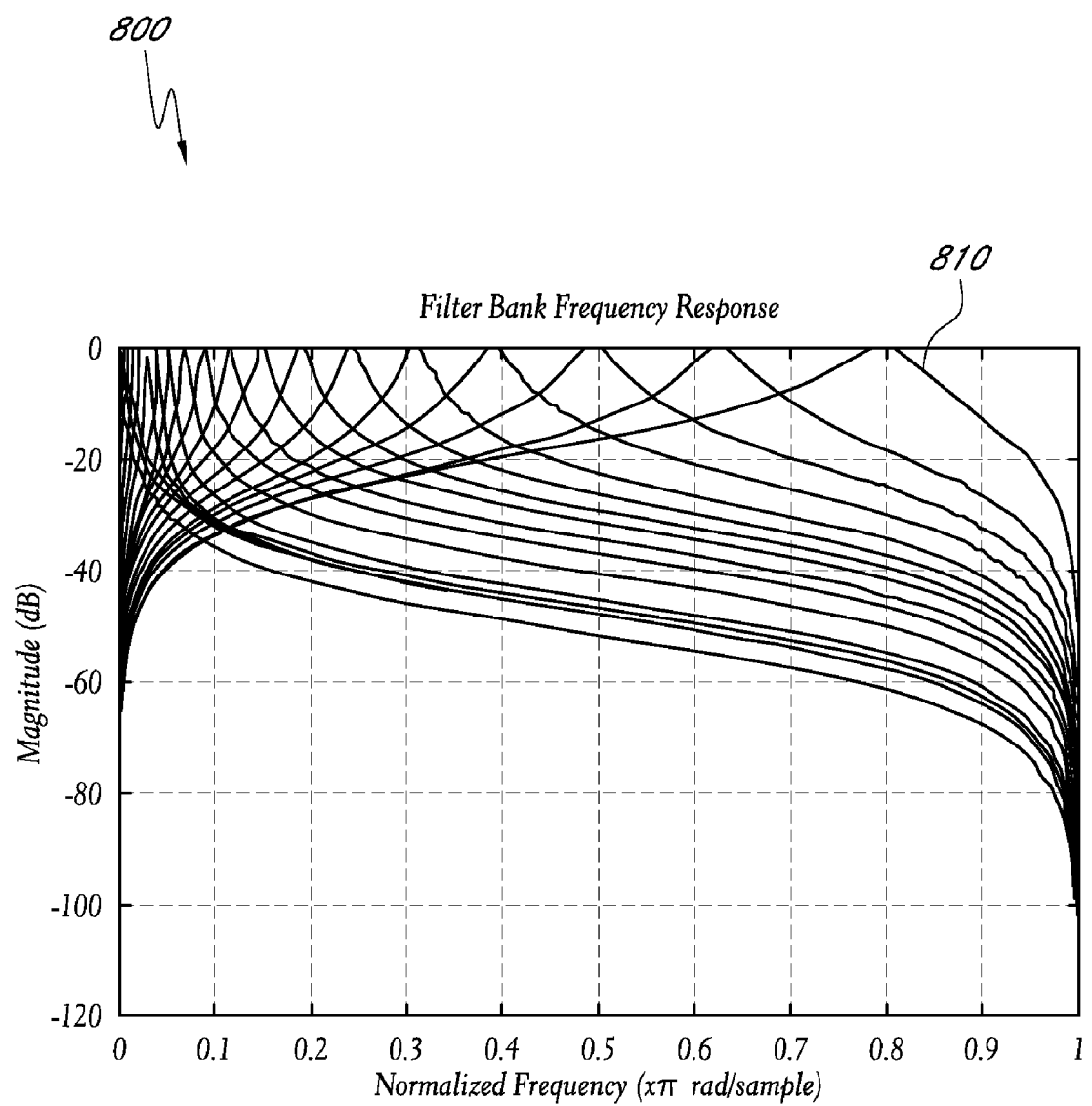
FIG. 8 illustrates an embodiment of a frequency response for a plurality of filters that approximate gammatone filters.

The human auditory system behaves as if it contained a bank of band-pass filters that have continuously overlapping center frequencies. An example of such a bank 100B of band-pass filters 160 is shown in FIG. 1B. Advantageously, in certain embodiments, the loudness analysis module 130 of FIG. 1A models this auditory structure with filters that approximate humans' natural band-pass filters (see FIG. 8). In certain embodiments, the loudness analysis module 130 uses lower-order approximations to auditory filters to use computing resources more efficiently.

Additionally, loudness can be measured for different individuals by utilizing one or more equal loudness curves, as described above. Example equal loudness curves 170 are shown in FIG. 1B. The loudness analysis module 130 may also use one or more loudness curves, or curves based on loudness curves, to weight the outputs of the auditory filters. Thus, by using the approximations to auditory filters and by using loudness curves, in addition to other processing that will be described below, the loudness analysis module 130 can estimate the loudness of the audio input signal 102.

The loudness analysis module 130 may also down sample, decimate, or otherwise reduce the amount of samples it uses to process audio information. By decimating the audio input signal 102, for instance, the loudness analysis module 130 uses fewer samples to estimate loudness. Decimation may be performed in certain embodiments because the human hearing system may not be able to detect loudness changes at the same sample rate used to sample the audio input signal 102. Decimation or other sampling rate techniques can reduce computing resources used to compute loudness.

As described above, the loudness analysis module 130 compares the computed loudness with a reference loudness level and outputs the level difference to the gain control module 140. The reference loudness level can be a reference that is internal to the loudness adjustment system 110. For example, the reference level can be a full scale loudness (e.g., 0 dB), so that adjusting the loudness to this level preserves dynamic range. In another embodiment (not shown), the reference level can be a volume level set by a user, e.g., via a volume control.

The gain control module 140 can apply the level difference to the audio signal input 110 on a sample by sample basis via mixers 142a and 142b. In certain embodiments, the gain control module 140 smooths transitions between samples or blocks of samples to prevent jarring loudness transitions. As a result, the mixers 142 may output an audio signal that has a constant average loudness level or substantially constant average loudness level. Thus, in certain embodiments, the loudness adjustment system 110 can transform the audio input signal 102 into an audio signal that has a constant average loudness level or substantially constant average loudness level.

The outputs of the mixers 142 are provided to mixers 152a, 152b. These mixers 152 are controlled by a volume control 150. The volume control 150 may be operated by a user, for example. The mixers 152 apply a gain to the output of the mixers 142 according to a volume setting of the volume control 150. The mixers 152 then provide an audio output signal 162, which may be provided to one or more loudspeakers or to other modules for further processing.

Figure 2A:
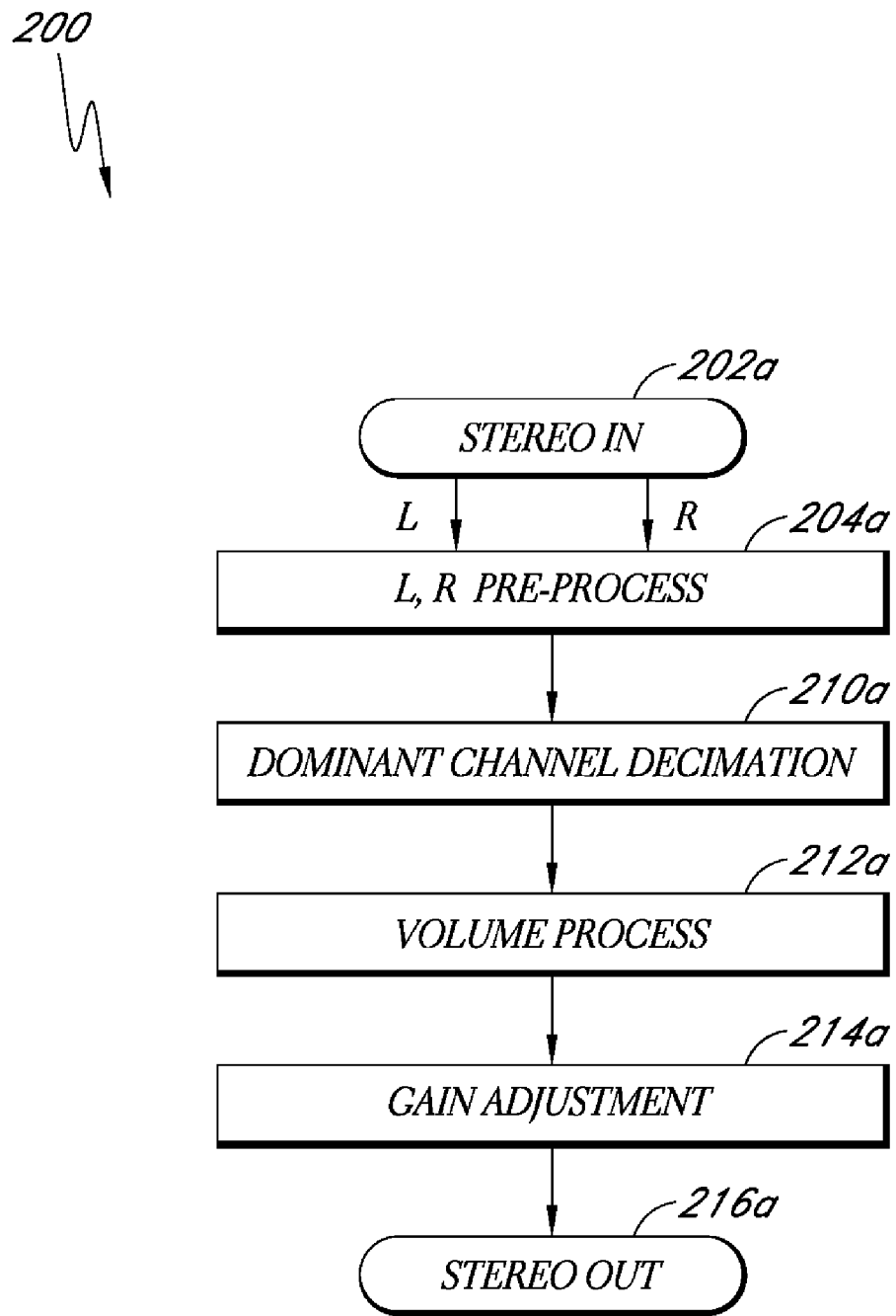
FIG. 2A illustrates an embodiment of a process for adjusting the perceived loudness of stereo signals.
Figure 2B:
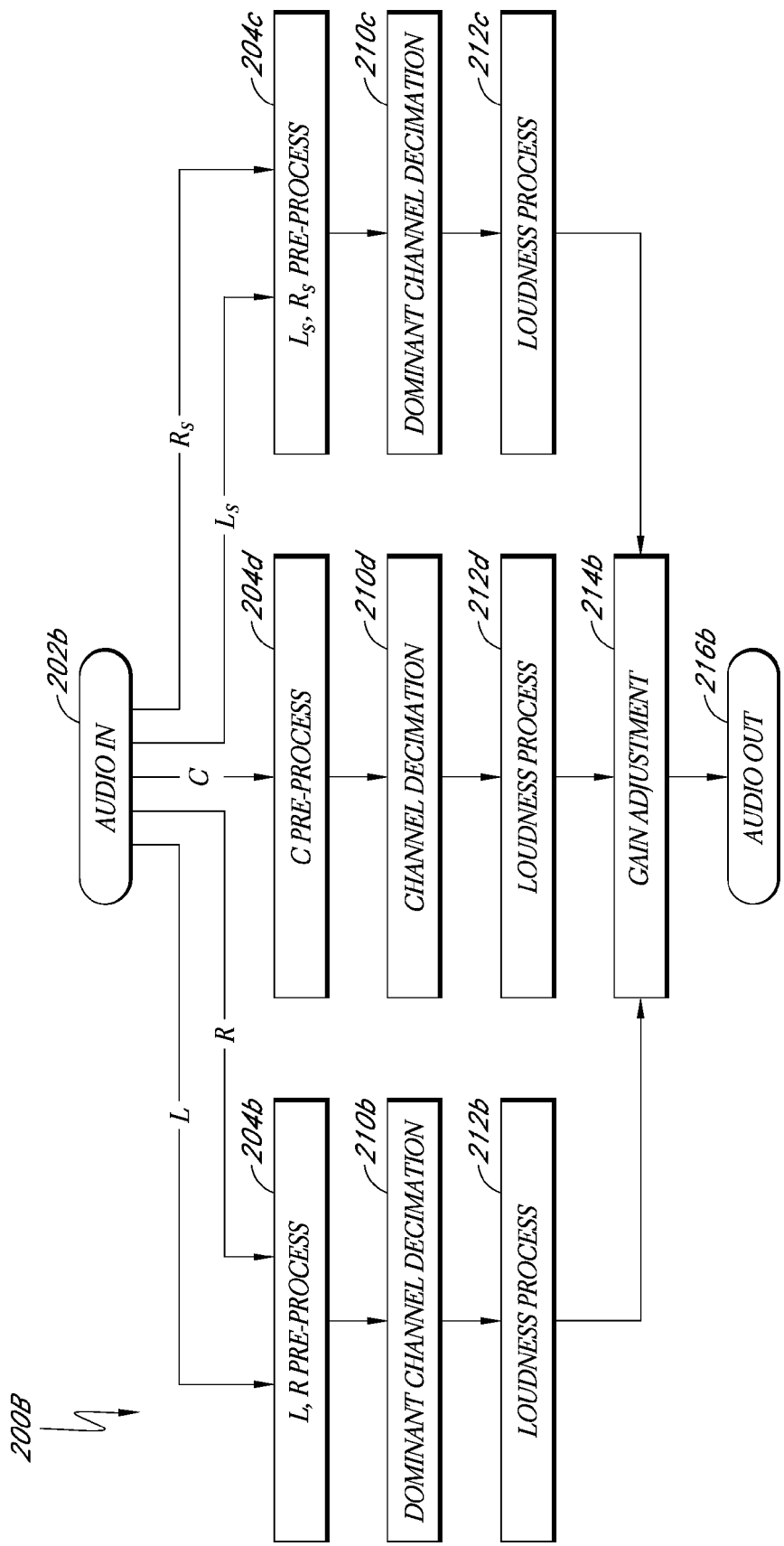
FIG. 2B illustrates an embodiment of a process for adjusting the perceived loudness of surround sound signals.

FIGS. 2A and 2B illustrate embodiments of loudness adjustment processes 200A, 200B for adjusting the perceived loudness of audio signals. Both processes 200 may be implemented by the loudness adjustment system 110. The process 200A illustrates example loudness adjustment of stereo signals, and the process 200B illustrates example loudness adjustment of multi-channel audio signals (e.g., greater than two channels), including surround sound signals.

Referring to FIG. 2A, a stereo input signal is received at block 202a. The stereo input signal 202a includes left and right channels. The channels can be divided into sample blocks that are each separately analyzed by the process 200A. Sample blocks are described in further detail below with respect to FIG. 3. At block 204a, the left and right channels can be pre-processed by calculating the energy or power of both channels. Based at least partly on this calculation, it can be determined which channel is dominant. The dominant channel can be selected for further loudness processing. Dominance may be determined per each sample block of the stereo input signal and may change from block to block.

In addition, as will be described in greater detail below, the pre-processing can include examining noise characteristics of the channels. If a sample block includes primarily noise, for instance, little or no loudness processing may be applied to that sample block.

At a decimation block 210a, the dominant channel signal can be decimated by downsampling and/or filtering the dominant channel. At a loudness process block 212a, a loudness of the lower-rate signal can be estimated by using one or more filters that approximate auditory filters and one or more loudness curves. A level difference may be further determined between the estimated loudness level and a reference loudness level.

At a gain adjustment block 214a, a gain can be calculated based on the level difference. This gain may be applied to both channels of the stereo input signal 202a, rather than just the decimated channel. The gain calculation can include a smoothing function that smooths the calculated gain over a plurality of samples of the stereo input signal. A stereo output signal is provided at block 216a based on the applied gain.

In alternative embodiments, a dominant channel is not selected, but rather each channel is processed to determine a loudness for the channel. A different gain may be applied to each channel based on the computed loudness. In another alternative embodiment, decimation is not performed, and the loudness process 212a operates on a full rate input signal or dominant channel. Many other implementations and configurations may also be used.

Referring to FIG. 2B, a multi-channel audio signal 202b is shown that includes left (L), right (R), center (C), left surround ($L_S$), and right surround ($R_S$) inputs. Although not shown, the audio signal 202b may also include a subwoofer input. These channels can be divided into sample blocks that are each separately analyzed by the process 200B. Sample blocks are described in further detail below with respect to FIG. 3.

Advantageously, in certain embodiments, the left and right inputs are provided as one pair to the pre-processing block 204b, and the left and right surround inputs are provided to the pre-processing block 204c. Each of these blocks 204b, 204c can calculate signal energy and determine a dominant channel, which is provided to a decimation block 210b or 210c, respectively. The pre-process block 204d may also calculate signal energy of the center input, but in certain embodiments does not select a dominant channel. However, the signal energy for the center channel may be used later in the process 200B.

Each of the decimation blocks 210 can decimate a selected channel and provide the decimate channel to a loudness process block 212b, 212c, or 212d, respectively. Each of the loudness process blocks 212 can determine a difference between a loudness of the channel and a reference level and output a level difference to a gain adjustment block 214b. Both of the decimation blocks 210 and the loudness process blocks 212 may have the same or similar features described above with respect to FIG. 2A.

In certain embodiments, the gain adjustment block 214b calculates a gain for each of the input channels based on the received level difference from the loudness process blocks 212. The gains may be different for each channel. In some implementations, it can be desirable to emphasize the center channel to increase listener perception of dialogue. However, the loudness processes 212 may generate gains that cause the various channels to drown out the center channel. To address this problem, the gain adjustment block 214b may generate a higher gain for the center channel than for the other channels. In one embodiment, the gain adjustment block 214b maintains a ratio between the gain for the center channel and gains for the other channels.

In alternative embodiments of the process 200B, a dominant channel is not selected, but all channels are processed to determine loudness, and a separate gain is applied to each channel. As another alternative, a dominant channel may be determined between the left and right channels but not between the left surround and right surround channels, or vice versa. In another alternative embodiment, decimation is not performed. In addition, the features shown in FIG. 2B may be extended to embodiments with additional speakers, such as 7.1 surround sound speaker arrangements. Many other implementations and configurations may also be used.

Figure 1C:
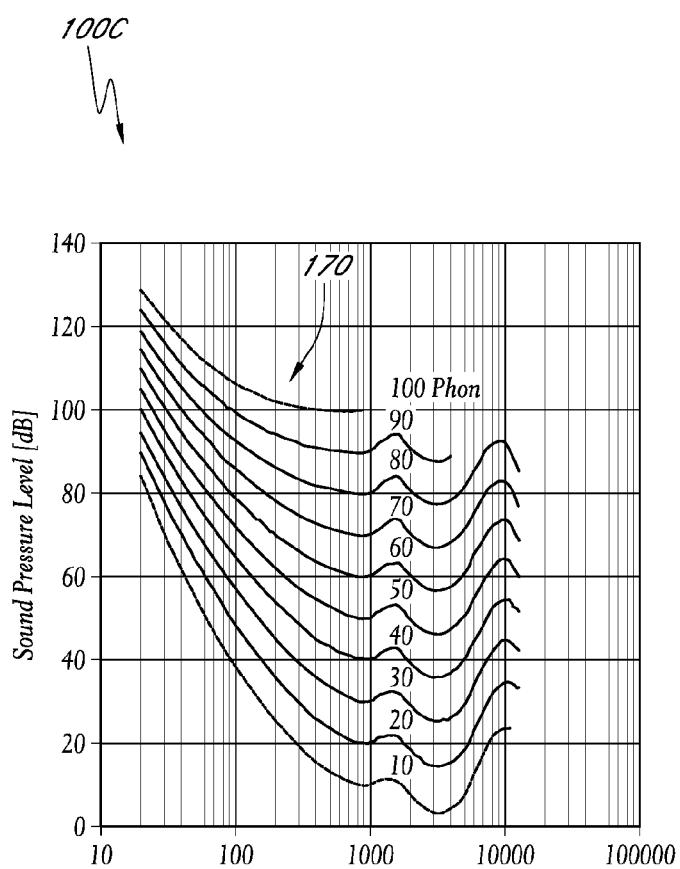
FIG. 1C illustrates a chart showing example equal loudness curves.
Figure 3:
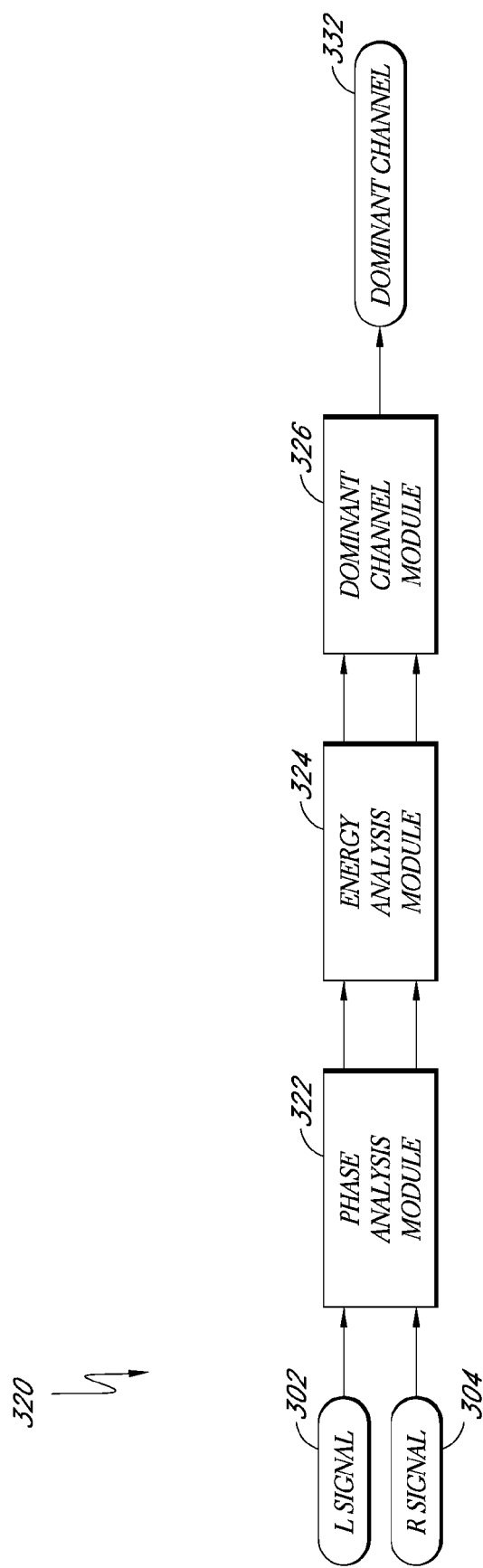
FIG. 3 illustrates an embodiment of an audio pre-processor.

FIG. 3 illustrates a more detailed embodiment of a pre-process module 320. The pre-process module 320 may have all the features described above with respect to FIGS. 1 and 2. The pre-process module 320 is shown receiving a stereo input signal having a left signal 302 and a right signal 304. For ease of illustration, the remainder of this description will refer primarily to stereo signals. However, the features discussed may likewise be applied to signals with fewer or more channels.

In certain embodiments, the preprocess module 320 operates on sample blocks of the left and right signals 302, 304. For example, the preprocess module 320 may buffer a number of incoming samples into a predetermined sample block size and then process the sample block. The size of the sample blocks may be chosen arbitrarily. For instance, each sample block may include 256, 512, 768 samples, or a different number of samples.

Currently available AGC systems usually do not discriminate between dialog and background noise such as effects. As such, background noise such as rain can potentially be amplified by these systems, resulting in background noise that may sound louder than it should relative to non-background noise. To address this problem, in certain embodiments sample blocks of the left and right signals 302 are provided to a phase analysis module 322. The phase analysis module 322 may include hardware and/or software for using phase analysis to detect background noise and non-background noise portions of each sample block of the left and right signals 302, 304.

The phase analysis module 322 can base its analysis on the insight that voiced (or non-background) samples may be highly correlated whereas non-voiced samples tend to be decorrelated. What this means is that if one examines the left and right channels 302, 304 on a per sample basis, voiced samples tend to have the same phase on both channels 302, 304 at the same time. In other words, voiced samples tend to be in-phase on both channels 302, 304. Non-voiced samples, on the other hand, tend to have different phase at the same point in time, such that a sample on one channel may be positive while a corresponding sample on the other channel may be negative. Thus, a phase distribution of primarily voiced samples may be highly correlated, whereas a phase distribution of primarily non-voiced samples may be less correlated.

Figure 4:
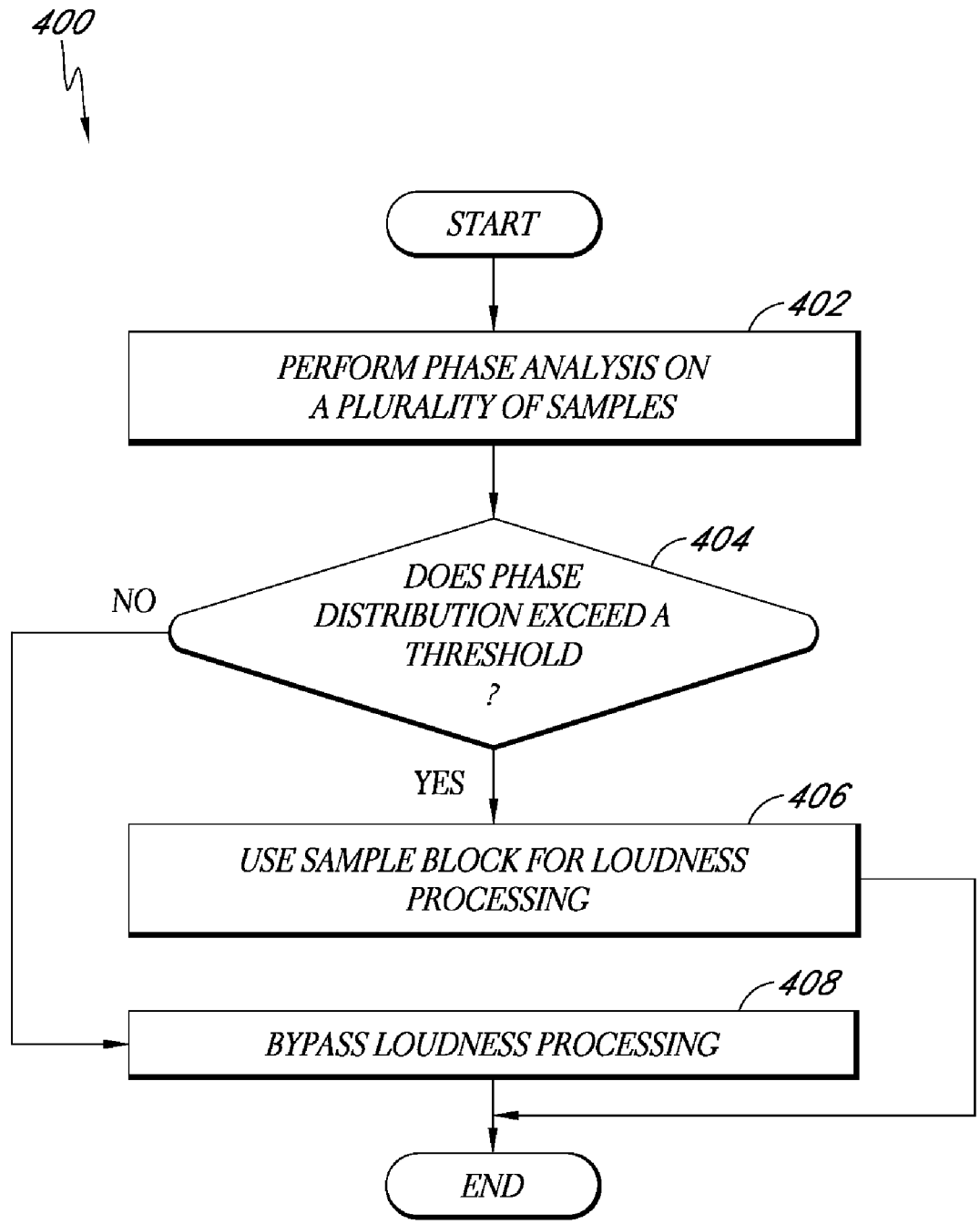
FIG. 4 illustrates an embodiment of a process for performing phase analysis.

The phase analysis module 322 can perform a process to determine if a given sample block includes primarily voiced or non-voiced samples, based on the insights described above. FIG. 4 illustrates an example embodiment of this process 400. At block 402, for a sample block, a phase analysis is performed on a plurality of samples. The phase analysis may include counting a number of pairs of samples that have the same or different phase on both input channels, negative phase on both input channels, and opposite phase. At this block, the phase analysis module 322 might, for instance, increment a counter for each pair of samples that are both the same or different phase.

At decision block 404, it is determined whether a phase distribution exceeds a threshold. For example, it can be determined whether a combined total number of sample pairs that have the same phase are greater than a threshold number. If so, at block 406, the sample block is used for loudness processing because the sample block may include or substantially include a voiced signal. Otherwise, loudness processing is bypassed on the sample block at block 408. This is because the sample block may include or substantially include a non-voiced signal. A minimum gain may be applied to the sample block to deemphasize the background noise of the sample block.

In alternative embodiments, loudness processing is applied to non-voiced sample blocks as well as voiced sample blocks. However, a lower gain may still be applied to sample blocks that contain a substantial number of non-voiced samples. In addition, the thresholds described above may be adjusted to more or less aggressively apply the phase analysis.

The phase analysis processes described above can also potentially be used in other applications. For example, this phase analysis may be used with hard limiters or other classic gain adjustment systems, such as compressors. Noise reduction systems can potentially benefit from the use of such analysis. Pitch detection systems can also use this analysis.

Referring again to FIG. 3, the phase analysis module 322 provides a sample block to an energy analysis module 324. For example, the phase analysis module 322 may provide a voiced sample block but not a non-voiced sample block to the energy analysis module 324. The energy analysis module 324 may include hardware and/or software for computing the energy or power of the sample block. For instance, the energy analysis module 324 may compute the mean square, the root mean square, or the like of the sample values in the sample block. The computed energy or power of the sample block may be used by a dominant channel module 326 to determine which of the left and right signal channels 302, 304 is dominant for the sample block (described below). In addition, the computed energy or power may be used for other purposes which will be described below.

The energy analysis module 324 may also compute the maximum or peak values of each channel of the sample block. The energy analysis module 324 may create a temporary buffer to hold this information. The temporary buffer may include the maximum value of the absolute value of the samples on each channel (L, R). The temporary buffer may also include a look-ahead delay line that the energy analysis module 324 populates with the maximum values of the samples of the next sample block. The look-ahead delay line will be described in greater detail below with respect to FIG. 11.

Referring again to FIG. 3, the energy analysis module 324 can provide the calculated energy or power, along with the calculated maximum value of each channel of the sample block to the dominant channel module 326. The dominant channel module 326 may use one or both of these values to determine which channel is dominant for a given sample block. For instance, the dominant channel module 326 might determine that the channel having a greater maximum value is a dominant channel or that the channel having the greater energy or power is the dominant channel.

Figure 5:
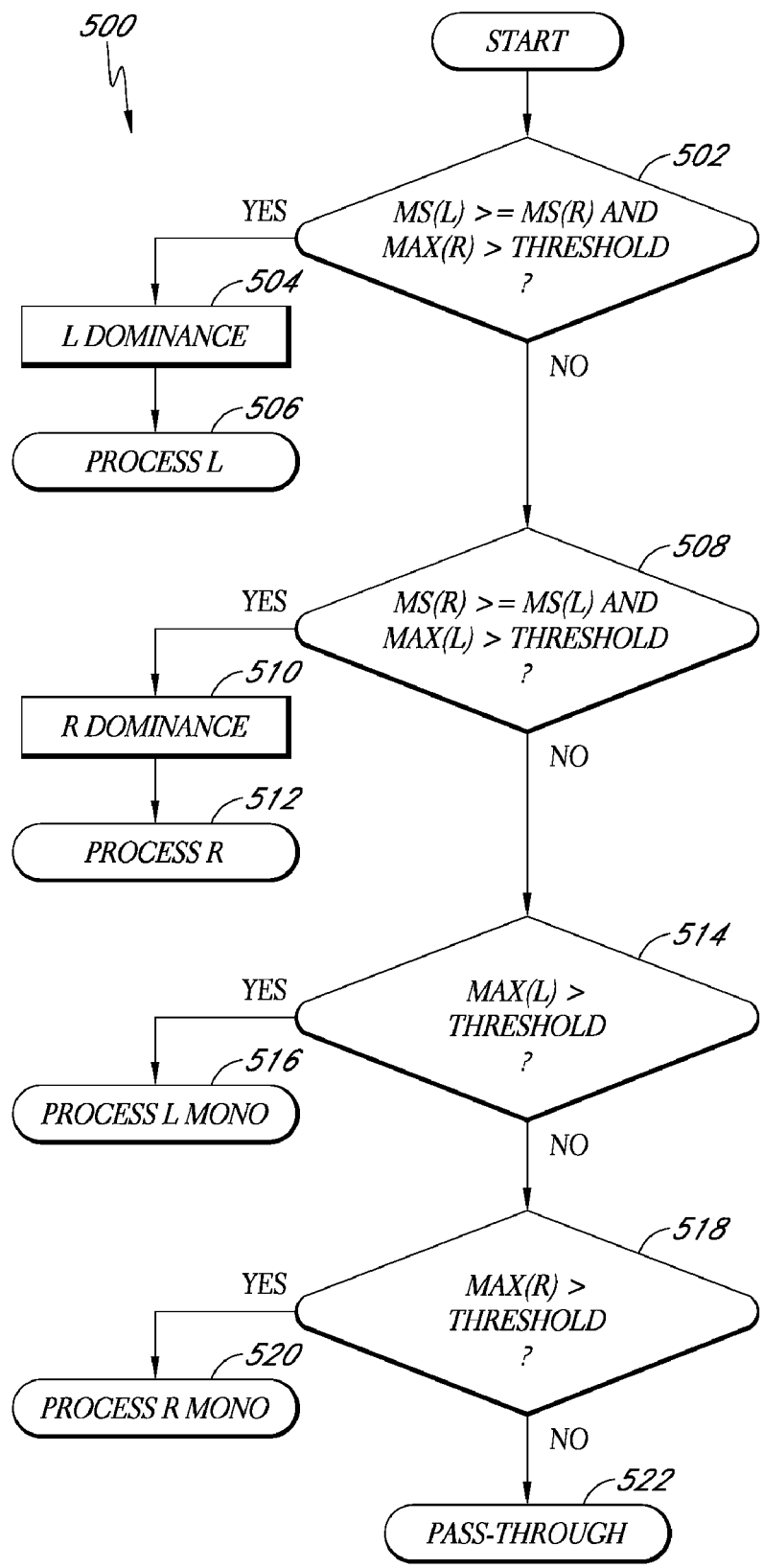
FIG. 5 illustrates an embodiment of a process for performing a dominant channel selection.

An example process 500 that may be performed by the dominant channel module 326 is illustrated in FIG. 5. At decision block 502, it is determined whether a mean square value for the left channel is greater than or equal to a mean square value for the right channel and whether a maximum value of the right channel is greater than a threshold value. The mean square value can be the energy or power of each channel. If the conditions of block 502 are true, then it is determined at block 504 that the left channel is dominant, and left channel may be provided for loudness processing at block 506.

On the other hand, if the conditions of block 502 are not true, it is further determined at decision block 508 whether a mean square value of the right channel is greater than or equal to a mean square value of the left channel and whether a maximum value of the left channel is greater than a threshold value. If so, then the right channel is considered to be dominant at block 510, and the right channel may be provided for loudness processing at block 512.

If the conditions of blocks 508 are not true, then a mono signal may be present, and at decision block 514, it is determined whether a maximum value of the left signal is greater than a threshold. If so, then the left channel is provided for loudness processing. Otherwise, it is further determined at decision block 518 whether a maximum value of the right channel is greater than a threshold. If so, the right channel is provided for loudness processing at block 520. Otherwise, the sample block is passed through at block 522 and is not provided for loudness processing because the sample block may be considered to not have any audio or substantially any audio.

Referring again to FIG. 3, the dominant channel module 326 outputs a dominant channel 332. The dominant channel module 326 may select a different dominant channel 332 for separate sample blocks. As described above, once the dominant channel is selected, the dominant channel may be provided for decimation and loudness processing. For example, the dominant channel module 326 may store the sample block corresponding to the dominant channel 332 in a dominant channel buffer (not shown).

Figure 6:
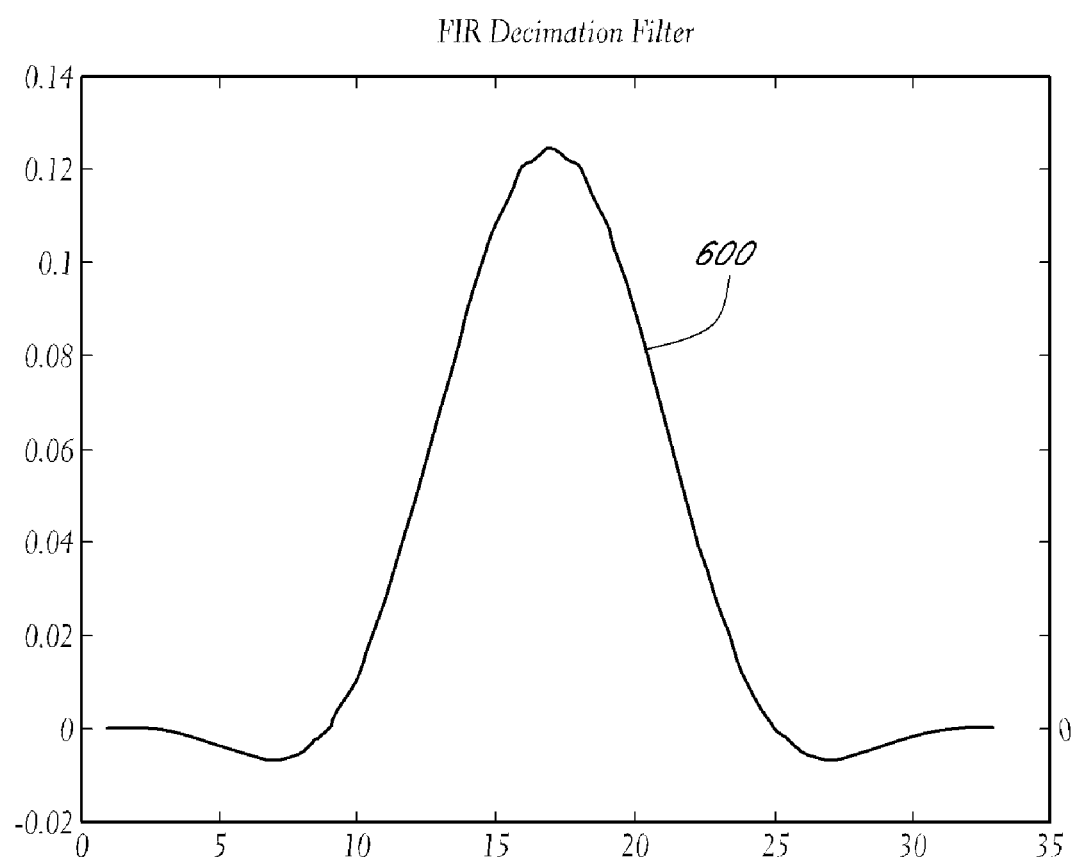
FIG. 6 illustrates an example decimation filter impulse response.

FIG. 6 illustrates an example impulse response 600 of a decimation filter. As described above, the decimation filter may be applied to the dominant channel to reduce the sample rate of that channel. Reducing the sample rate of the dominant channel can facilitate loudness processing with fewer computing resources.

The decimation process in certain embodiments includes a decimation filter that may down-sample the dominant channel buffer described above with respect to FIG. 3. This down-sampling can include using a sampling-rate dependent decimation factor. The down-sampled buffer is used in certain embodiments only for loudness analysis purposes and is not provided as output to end users. The down-sampled signal can be band-limited by a filter (e.g., a low-pass filter) to avoid anti-aliasing. Thus, the decimation filter having the impulse response 600 of FIG. 6 can be one example of such a filter.

The decimation filter having the impulse response 600 shown is a length 33 finite impulse response (FIR) filter. This filter can be derived by windowing the causal ideal impulse response, as represented in equation (1):

$$h(n')=w(n')d(n'-LM) \qquad (1)$$

In equation (1), the ideal impulse response is given by:

$$d(k') = \frac{\sin(\pi k'/L)}{\pi k'} \qquad (2)$$

The decimated sample is then given by:

$$y_{down}(n) = y'(nL) = \sum_{m'=0}^{N-1} h(m')x'(nL-m') \qquad (3)$$

Advantageously, in certain embodiments, each decimated sample block may be used for more computing resource-efficient loudness processing.

Figure 7:
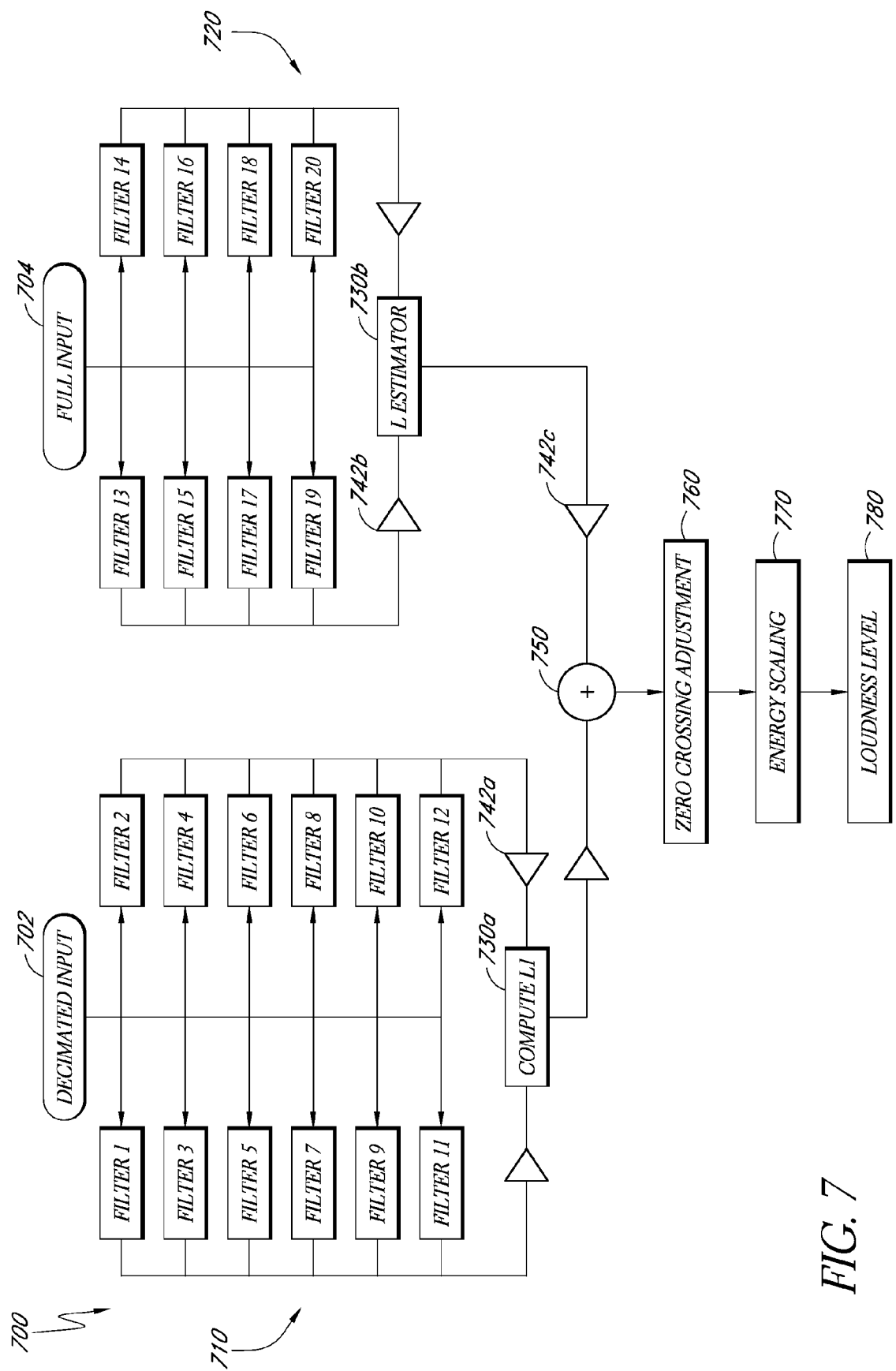
FIG. 7 illustrates an embodiment of a loudness process for determining loudness.

FIG. 7 illustrates an embodiment of a loudness process 700 for determining loudness. The loudness process 700 can be implemented by the loudness adjustment system 110, and in particular, the loudness analysis module 130. In addition, embodiments of the loudness process 700 correspond to the loudness process blocks 212a, 212b, 212c, and 212d. The loudness process 700 may compute an estimated loudness for a sample block. The loudness process 700 may further compare the estimated loudness with a reference level to determine a level difference to be applied to the sample block.

In the depicted embodiment, a decimated input 702 is provided to approximation filters 710. The decimated input 702 may include a decimated sample block created by the decimation filter described above with respect to FIG. 6. Each of the approximation filters 710 can be band-pass filters that approximate the auditory peripheral system. In one embodiment, the filters 710 each approximate a gammatone filter. In another embodiment, the filters approximate octave filters or other band-pass filters that approximate the auditory peripheral system.

Gammatone filters have been used to simulate the bank of band-pass filters of the human ear described above with respect to FIG. 1B. An equation describing gammatone filters in the time domain is given by:

$$g(t)=at^{n-1}\cos(2\pi ft+\phi)e^{-2\pi bt} \qquad (4)$$

In equation (4), a denotes amplitude, f denotes frequency, n is the order of the filter, b is the filter's bandwidth, and $\phi$ is the filter's phase.

Gammatone filters can be processing-intensive filters and therefore may not be appropriate choices for electronic devices with low computing resources, such as some televisions. Thus, in certain embodiments, each of the filters 710 approximates a gammatone filter. The filters 710 may also have different center frequencies to simulate the bank of band-pass filters of the human ear. At least some of the filters 710 may be first-order approximations to a gammatone filter. Each first-order approximation may be derived in certain embodiments by a) using a first order Butterworth filter approximation matching a selected center frequency for each filter and by b) using a least squares fit to the frequency response of the initial Butterworth estimate. The filters 710 can each be implemented as an Infinite Impulse Response (IIR) filter to use processing resources more efficiently.

Another input 704 is also provided to other approximation filters 720. In certain embodiments, the input 704 is a full-rate sample input, rather than a decimated input. The full-rate input 704 may be used for some frequency bands that human ears are more sensitive to, for higher frequency bands, or the like. In addition, the full-rate input 704 may be used to prevent certain frequency fold-back effects.

The full-rate input 704 is provided to the filters 720. Like the filters 710, the filters 720 can be band-pass filters that approximate gammatone filters. The filters 720 may be derived in a similar manner as described above for the filters 710. However, in certain embodiments, the filters 720 are second-order approximations to the gammatone filters. These filters 720 may also be IIR filters. Normalized frequency responses 1110 for a set of example approximation filters is shown in a plot 1100 of FIG. 8.

In other embodiments, all of the filters operate on decimated inputs (or instead, full-rate inputs). In addition, the number of filters shown is one example, and this number can vary, with fewer filters resulting in possibly better performance with possibly reduced accuracy. The number of filters selected may also depend on the size of available speakers, with larger speakers using more filters.

The filters 710, 720 provide filtered samples to gain blocks 742a, 742b, respectively, which in turn provide the samples to loudness estimators 730a, 730b, respectively. Each of the loudness estimators may implement a loudness estimation process, such as the loudness estimation 1200 depicted in FIG. 9.

Figure 9:
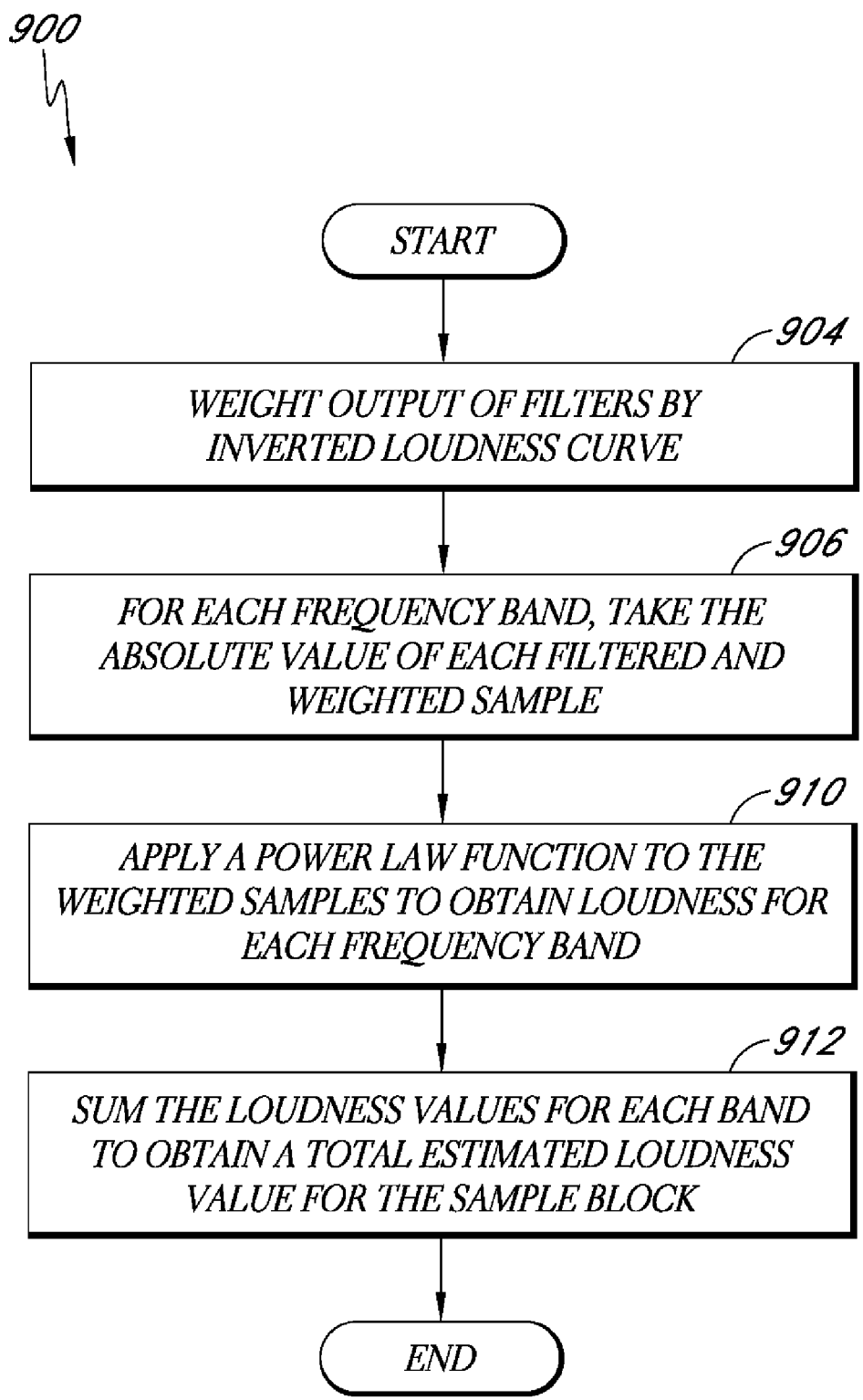
FIG. 9 illustrates an embodiment of a loudness estimation process for determining loudness.
Figure 10A:
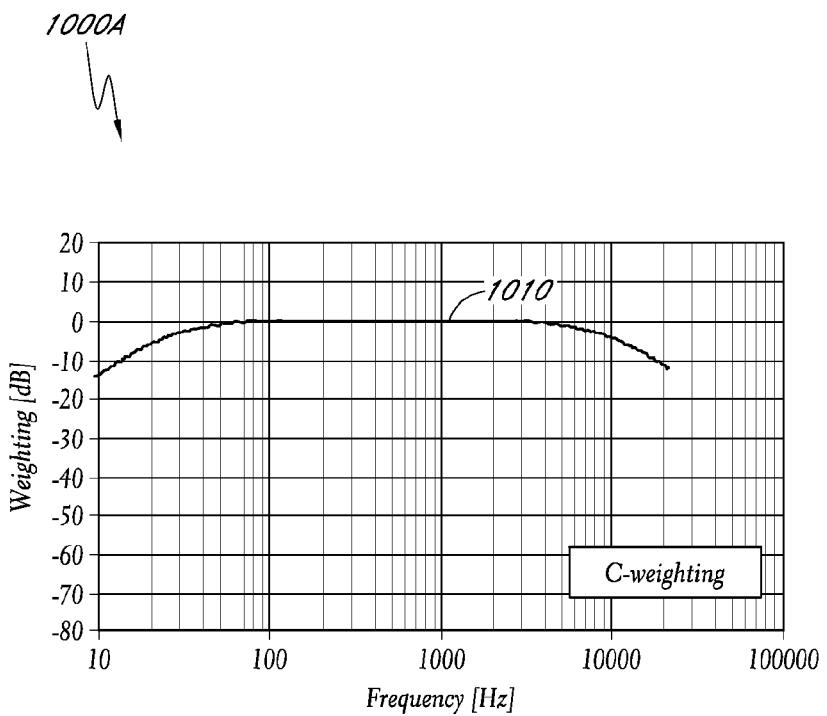
FIG. 10A illustrates an example C-weighting curve that may be used to develop the approximation filters in certain embodiments.
Figure 10B:
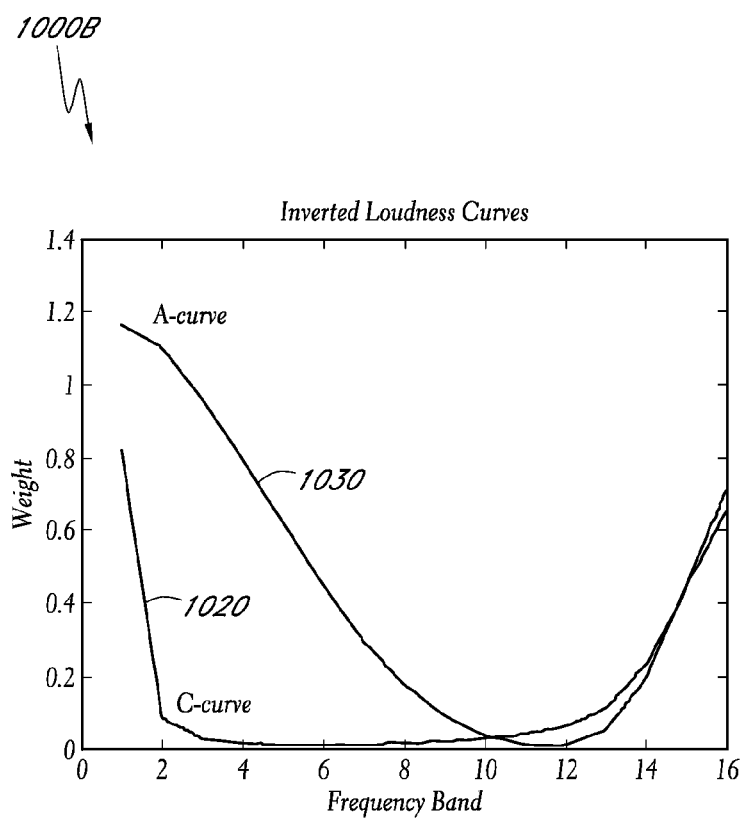
FIG. 10B illustrates example inverted weighting curves that may be used to develop the approximation filters in certain embodiments.

Referring to FIG. 9, at block 904, each of the loudness estimators 730 may weight the output of the filters 710 or 720 (e.g., via gain blocks 742) by an inverted loudness curve. The inverted loudness curve may be based on one of a number of possible loudness weighting curves. For example, FIG. 10A illustrates a plot 1000A of an example loudness weighting curve 1010 called a C-weighting curve. The C-weighting curve can be based on a 100-phon loudness curve (see FIG. 1C). FIG. 10B illustrates a plot 1000B of an example inverted C-weighting curve 1020 that can be used at block 904 of the process 900. Also shown is an example inverted A-weighting curve 1030 that may be used in other embodiments. The characteristics of the curves 1020, 1030 may depend on the sampling rate chosen.

Referring again to FIG. 9, the weighting in block 904 may include multiplying the samples by a value on an inverted loudness curve that corresponds to a frequency band for the samples. For instance, the plot 1300B of FIG. 10B illustrates 16 frequency bands on the x-axis (corresponding to 16 approximation filters in one embodiment). The corresponding weight value for the inverted C-weighting curve 1020 for a given frequency band can be found on the y-axis.

Again turning to FIG. 9, at block 906, the absolute value of each filtered and weighted sample is taken for the samples in each frequency band. At block 910, a power law function is applied to the weighted samples of each frequency band to obtain an estimated loudness for each frequency band. This function may be applied to samples that are above a certain threshold. The power law function may instead by applied to an average of the samples of each frequency band. The power law function may be of the form:

$$L_{band} = bI^k \quad (8)$$

where I represents a weighted sample for a given band or an average of the samples, b and k represent constants that can be determined experimentally, and $L_{band}$ represents loudness for that band.

At block 912, an estimated total loudness of a sample block is computed by summing the loudness values for each band. For example, the output of equation (8) for each band can be summed to obtain the estimated loudness for a sample block.

Referring again to FIG. 7, the output of each loudness estimator 730 is scaled by a gain block 742c and provided to a sum block 750, where the estimated loudnesses are added together to provide a total estimated loudness. This total estimated loudness is provided to a zero crossing adjustment block 760 and to an energy scaling block 770. The zero crossing adjustment block 760 uses a zero crossings count to distinguish between noise-like and period-like signals in addition to the phase analysis described above. For example, the zero-crossing adjustment block 760 can detect signals that have more zero crossings and determine that these signals may contain more noise. The zero-crossing adjustment block 760 can boost the level of the non-noise-like low-level signals further up when needed.

The energy scaling block 770 weights the total estimated loudness by the energy or power of the block that was calculated by the energy analysis module 324 (FIG. 3). This weighting can be of the form:

$$Level = \frac{aL_{total}}{E} \quad (9)$$

In equation (9), a is a constant that can vary based on a user-defined mode. In one embodiment, two loudness control modes can be applied, either light or normal. Light control may perform a less aggressive loudness adjustment. The value of the constant "a" may be lower, for example, for light loudness adjustment. $L_{total}$ represents the total estimated loudness, and E represents the energy of the block. Level refers to a calculated loudness level 780 for this sample block. This overall loudness level can represent a scalar value that the gain of the signal should reach in order for the loudness of the sample block to follow an equal loudness curve used above (e.g., the 100-phon curve upon which the C-weighting curve was based).

Scaling the total estimated loudness by the energy E (or in other implementations, power) of the block is done in certain embodiments because some signals are below an audible threshold. If these signals were measured for loudness based on one of the loudness curves above, the signals might not be close enough to the loudness curve to calculate an accurate loudness. Thus, the total estimated loudness can be equalized with the energy of the block. Dividing the total estimated loudness by a small energy from a low-signal block can boost the overall level estimation.

Figure 11:
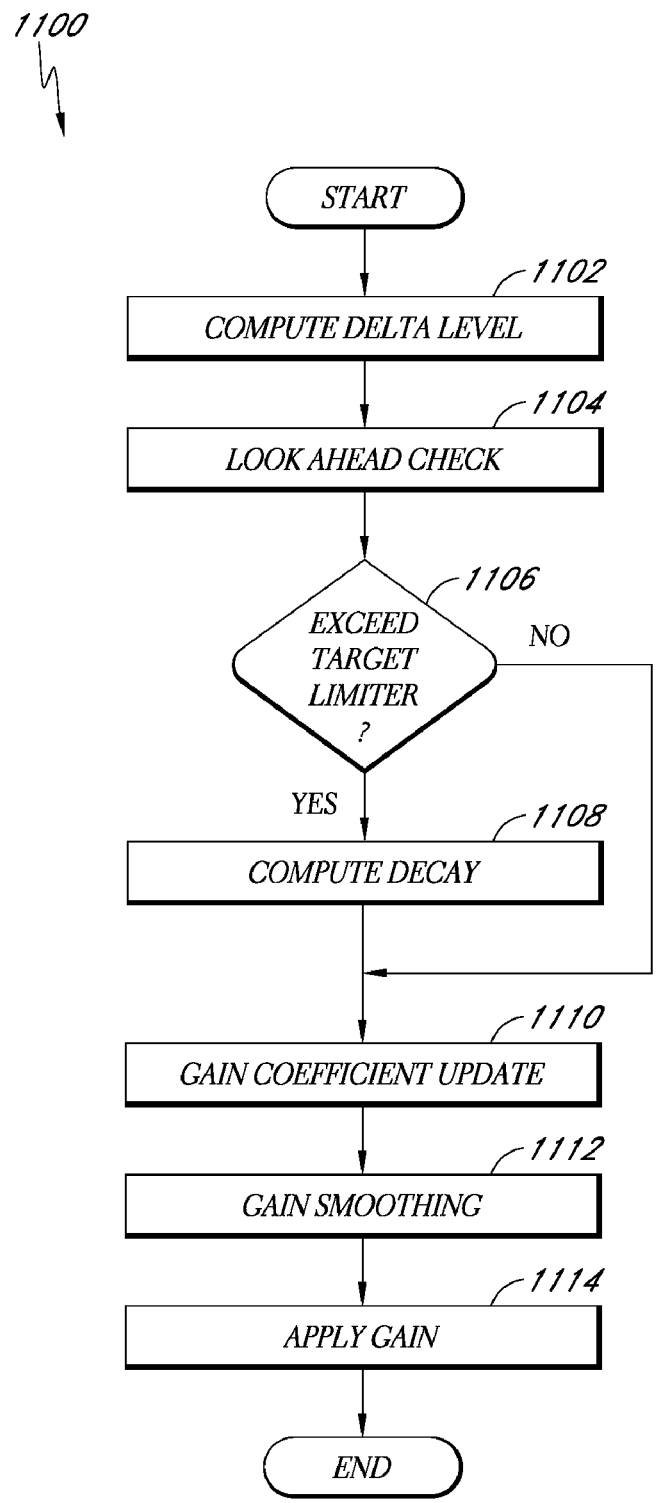
FIG. 11 illustrates an embodiment of a process for adjusting gain based on the measured loudness.

FIG. 11 illustrates an embodiment of a gain adjust process 1100 for adjusting gain based on the measured loudness. The process 1100 may be implemented by the gain control module 140 of FIG. 1, e.g., once the gain control module 140 has received the overall loudness level calculation described above with respect to FIG. 7. As the loudness level of two consecutive sample blocks can differ, different gain coefficients may be generated for each block to bring the blocks to the reference level. To avoid abrupt changes in gain, the gain adjust process 1100 can incrementally apply the gain coefficients. In addition, the gain adjust process 1100 can calculate gain coefficients for one channel (e.g., the dominant channel) and apply the gain coefficients to both channels.

At block 1102, a delta level is computed. The delta level can include a difference between the last gain coefficient (e.g., for a previous sample) and the overall level determined above with respect to FIG. 7. This difference can be multiplied by a constant, g. The result is the delta gain that may be applied incrementally on a sample-per-sample basis:

$$delta\ gain = (Level - Last\ Gain\ Coefficient)*g \quad (10)$$

The constant g can effectively break down the difference between the level calculation and the last gain coefficient (LGC) into a smaller delta gain. In certain embodiments, when the gain control module 140 is first initialized, the LGC is set to 1.0 scalar (or 0 dB), as a reference level to which the overall loudness level is correlated or equalized. In certain embodiments, this is a full-scale reference level used to preserve dynamic range.

As will be described below, the delta gain can be applied incrementally to each sample of the sample block until a sample multiplied by its corresponding gain coefficient reaches a certain percentage of a scaled full scale value. Thus, the first sample of the sample block may have a gain that is $LGC_1$+delta gain. For the next sample, there is a new $LGC_2$ that is equal to $LGC_1$+delta gain. Thus, the gain of the second sample may be $LGC_1$+delta gain. Thus, the delta gain can be used to gradually transition from the gain coefficient(s) of a previous sample block to a new set of gain coefficients based on the dynamically changing loudness computation of FIG. 7. This gradual transition can potentially reduce abrupt changes in the output level of the signal.

To prevent further abrupt changes, at block 1104, a look-ahead line is employed to check if the update of the gain coefficient by increments of the calculated delta gain will result in the corresponding sample's value exceeding a target limiter level. The look-ahead line may be the look-ahead line described above with respect to FIG. 3. The look-ahead line may include samples from a sample block that comes after the current sample block being processed. The look ahead line can be populated with the maximum sample of every left and right sample pair. By including the max of the absolute value of each sample pair of the block, the look ahead line can ensure that the output signal level will not exceed the set reference level in certain embodiments. As a result, one channel can be used to analyze the gain coefficients, rather than both channels.

At decision block 1106, it is determined whether the target limiter level will be exceeded. If so, a decay can be computed at block 1108 and the delta gain may be zeroed for that sample. The decay value can be computed by taking into consideration the index in the look-ahead line at which the corresponding sample's value would exceed the target limiter level. The index can be an array index or the like. This decay may be computed using the following:

$$\text{Decay} = \frac{-|R - G|}{\text{index}} \quad (11)$$

where R denotes the target limiter level, G is the current gain coefficient, and index is the index into the look-ahead line where the sample's value would exceed the target limiter level. In one embodiment, the points at which a decay value are computed for the current sample block are also stored in a temporary buffer and are used later in the process 1100 to smooth the calculated gain coefficients around the detected decay points.

At block 1110, the gain coefficient for a current sample is updated by an amount equal to the current delta gain, as described above. This delta gain is either the delta gain that has been calculated using equation (10) or it is zero if a decay point has been detected. If a decay point has been detected, the gain coefficient is updated by means of the computed decay calculated by equation (11), for example, by adding the decay to the last gain coefficient. At block 1112, the gain coefficients are then smoothed. For example, the gain coefficients can be processed by a first order smoothing function.

The smoothing function may use the stored indices of the decay occurrences in the look-ahead line. The smoothing function can be applied either forward or backwards in the gain coefficients temporary buffer depending on where the decay points are in the buffer. By applying the smoothing function, neighboring gain coefficients can be adjusted so that there is a smoother gain transition around the decay points.

The gain is applied for each sample at block 1114. As a result, in certain embodiments the process 1100 may output an audio signal that has a substantially constant average loudness level, with some possibly minor variations in loudness as the gain is smoothed between samples. The output signal may also track or substantially track a loudness curve that was selected above (e.g., the 100 phon curve or another curve). Thus, prior to volume processing by a user in one embodiment (see FIG. 1A), the loudness for one sample block may be substantially the same as the loudness for a previous sample block.

Conclusion

Depending on the embodiment, certain acts, events, or functions of any of the algorithms described herein can be performed in a different sequence, may be added, merged, or left out all together (e.g., not all described acts or events are necessary for the practice of the algorithm). Moreover, in certain embodiments, acts or events may be performed concurrently, e.g., through multi-threaded processing, interrupt processing, or multiple processors or processor cores, rather than sequentially.

The various illustrative logical blocks, modules, and algorithm steps described in connection with the embodiments disclosed herein may be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the disclosure.

The various illustrative logical blocks and modules described in connection with the embodiments disclosed herein may be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be a processor, controller, microcontroller, or state machine, combinations of the same, or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium can be coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated may be made without departing from the spirit of the disclosure. As will be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

What is claimed is:

1. A method of adjusting a loudness of an audio signal from a multi-media device to present a substantially constant perceived loudness to a listener despite loudness level changes in the audio signal, the method comprising:
   receiving an electronic audio signal comprising two or more channels of audio;
   selecting at least one of the channels of audio, said selecting comprising:
   determining a dominant channel of the two or more audio channels and selecting the dominant channel, wherein said determining the dominant channel comprises computing an energy value from each channel and selecting the channel with the energy value that is highest as the dominant channel;
   estimating a loudness of the dominant channel with one or more processors to produce an estimated loudness, said estimation comprising:
   processing the dominant channel with a plurality of approximation filters configured to approximate a plurality of gammatone filters, such that the plurality of approximation filters simulate a bank of auditory filters of the human ear, and
   weighting outputs of the approximation filters by an inverted loudness weighting curve; and
   computing at least one gain based at least in part on the estimated loudness to cause a perceived loudness of the audio signal to remain substantially constant for a period of time, said computing comprising:
   calculating a gain for a portion of the audio signal based at least partly on the estimated loudness, and
   smoothing the gain over a plurality of samples of the audio signal portion.

2. The method of claim 1, further comprising decimating the dominant channel.

3. The method of claim 1, wherein said smoothing the gain over the plurality of samples comprises incrementally increasing the gain over the samples.

4. The method of claim 1, wherein the approximation filters comprise first-order band-pass filters.

5. The method of claim 1, further comprising deriving the approximation filters by using one or more Butterworth filter approximations to the gammatone filters.

6. The method of claim 5, wherein said deriving further comprises using a least squares fit to a frequency response of the one or more Butterworth filter approximations.

7. The method of claim 1, wherein a number of the approximation filters depends at least partly on a speaker size configuration.

* * * * *